United States Patent
Lin et al.

(10) Patent No.: US 8,576,101 B1
(45) Date of Patent: Nov. 5, 2013

(54) CALIBRATION OF AN R2R LADDER BASED CURRENT DIGITAL-TO-ANALOG CONVERTER (DAC)

(71) Applicant: Google Inc., Mountain View, CA (US)

(72) Inventors: Cheng-Yi Andrew Lin, Mountain View, CA (US); Arnold Feldman, San Francisco, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/668,706

(22) Filed: Nov. 5, 2012

(51) Int. Cl.
    *H03M 1/06* (2006.01)
(52) U.S. Cl.
    USPC .......................................... 341/118; 341/144
(58) Field of Classification Search
    USPC .......... 341/118, 120, 144, 154; 323/271–272, 323/350–351
    See application file for complete search history.

(56) References Cited

U.S. PATENT DOCUMENTS

| | | | | |
|---|---|---|---|---|
| 4,458,201 | A * | 7/1984 | Koen | 323/317 |
| 7,042,374 | B1 * | 5/2006 | Manganaro | 341/120 |
| 7,162,029 | B2 | 1/2007 | Soman et al. | |
| 7,292,167 | B2 * | 11/2007 | Hsieh | 341/120 |
| 7,541,953 | B2 * | 6/2009 | Chen et al. | 341/120 |
| 7,564,385 | B2 | 7/2009 | Soude et al. | |
| 2011/0089988 | A1 | 4/2011 | Lin | |

FOREIGN PATENT DOCUMENTS

EP          1792402          7/2009

\* cited by examiner

*Primary Examiner* — Brian Young
(74) *Attorney, Agent, or Firm* — Morris & Kamlay LLP

(57) ABSTRACT

A R2R ladder circuit implementation of a digital-to-analog convertor (DAC) may be configured to compensate for mismatch in each of a plurality of current sources in the R2R ladder circuit. The compensating of mismatch in each of the plurality of current sources may be achieved by adding one or more auxiliary current sources associated with each of the plurality of current sources, which may be used to provide pre-configured auxiliary current that would enable compensating for mismatch in current of an associated one of the plurality of current sources. For example, each of the plurality of current sources may have two auxiliary current sources, connected in parallel therewith, with one of two auxiliary current sources being switched to the positive-side and the other auxiliary current source being switched to the negative-side. The switching structure of the modified R2R ladder circuit may be implemented in any semiconductor technology (e.g., BiCMOS technology).

15 Claims, 5 Drawing Sheets

CALIBRATION OF AN R2R LADDER BASED CURRENT DIGITAL-TO-ANALOG CONVERTER (DAC)

TECHNICAL FIELD

Aspects of the present application relate to use digital-to-analog converters in electronic devices. More specifically, certain implementations of the present disclosure relate to calibration of an R2R ladder based current digital-to-analog convertor (DAC).

BACKGROUND

Electronic systems often require high fidelity conversion of digital signals (represented as binary ones and zeros) to continuous analog signals (represented as voltage current or electric charge). In audio playback systems from digital sources such as compact disc players, DVD players, music or video streaming devices a high fidelity conversion from digital bits to continuous time analog signals is required prior to driving the speaker. Sound quality is directly related to the quality of this conversion as any noise or distortion is audible. Similarly, when generating an analog signal from digital bits in a test and measurement system, measurement accuracy is determined by the noise and distortion generated in the digital-to-analog conversion process. In the transmitter of a wireless or wireline communication system, noise and distortion generated by the digital-to-analog conversion may limit the ability to receive correct data at the opposite end of the link. For example in instances where the digital-to-analog-conversion process involves generating or adjusting continuous current based on the digital input, mismatch in the current sources controlled by the digital input may result in distortion at the converter output adversely affecting the performance of the electronic system.

Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and/or method is provided for calibration of an R2R ladder based current digital-to-analog convertor (DAC), substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

DETAILED DESCRIPTION

Figure 1:
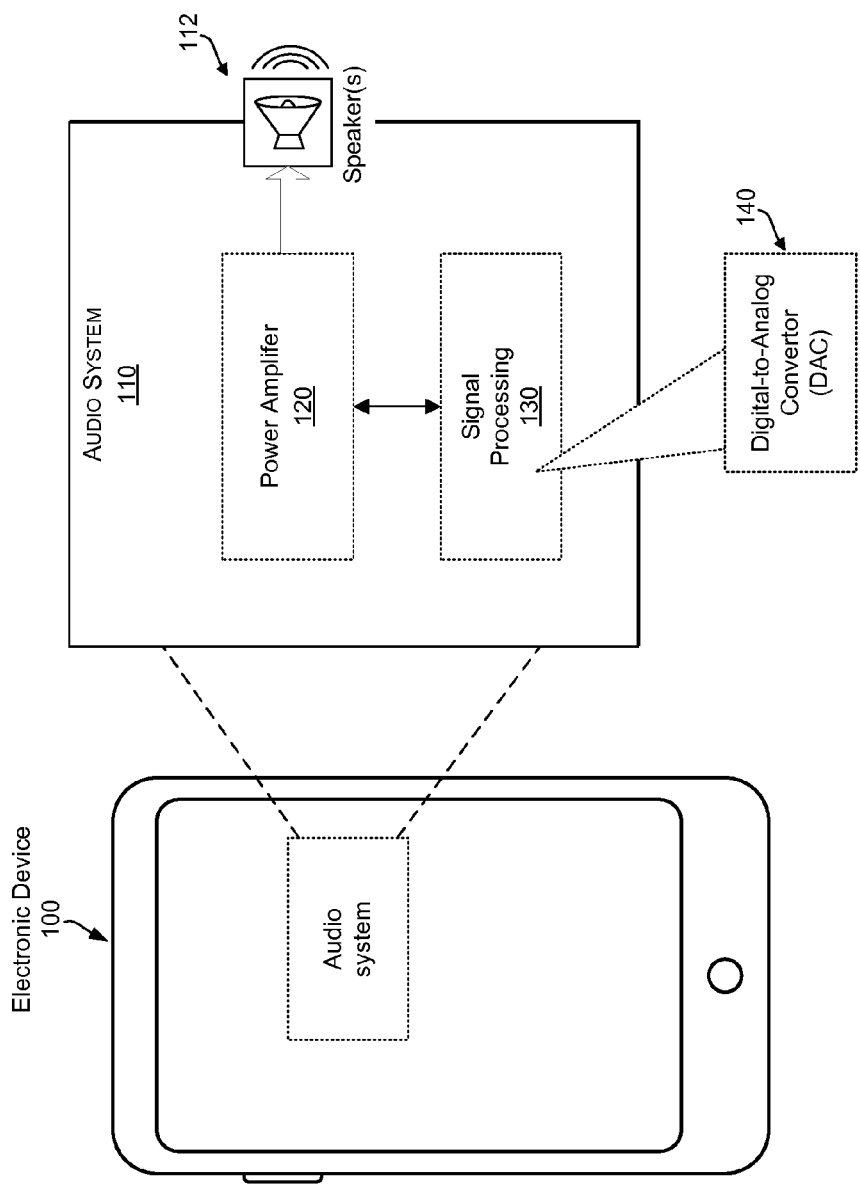
FIG. 1 is a block diagram illustrating an electronic device comprising a digital-to-analog convertor (DAC) implementing R2R ladder based topology.

The present disclosure relates to a method and system for calibration of an R2R ladder based current digital-to-analog convertor (DAC). In various implementations, operation of a R2R ladder digital-to-analog convertor (DAC) circuit may be controlled, so as to compensate for mismatch occurring therein. The R2R ladder DAC circuit may comprise a plurality of resistors, which may be configured in a passive resistive divider manner, and a plurality of main current sources, with each of the plurality of main current sources having a plurality of auxiliary current sources associated therewith. In this regard, the compensating for mismatch during operations of the R2R ladder DAC circuit may comprise applying during operation of each of the plurality of main current sources, an auxiliary current from at least one of the corresponding plurality of auxiliary current sources. The plurality of main current sources may be configured to apply the auxiliary current in parallel with a current applied from a corresponding one of the plurality of main current sources. The at least one of the corresponding plurality of auxiliary current sources may be selected when the auxiliary current is applied. In this regard, the plurality of auxiliary current sources may comprise a negative-side auxiliary current source and a positive-side auxiliary current source when the R2R ladder DAC circuit comprises a differential circuit with negative-side and positive-side current sources. Thus, the negative-side current source may be selected when a current of a corresponding main current source is applied to the negative-side, and the positive-side current source may be selected when the current of the corresponding main current source is applied to the negative-side. Each of the plurality of auxiliary current sources may be calibrated to determine a corresponding particular auxiliary current. In this regard, the R2R ladder DAC circuit may comprise a calibration sub-circuit associated with each of plurality of main current sources for calibrating the corresponding plurality of auxiliary current sources to provide the auxiliary current based on a determination of mismatch at corresponding one of the plurality of main current sources. The calibration sub-circuit associated with each of plurality of main current sources may be configured to determine an auxiliary current associated with each of a corresponding plurality of auxiliary current sources based on a determination of required compensation for a mismatch at a corresponding one of the plurality of main current sources.

As utilized herein the terms "circuits" and "circuitry" refer to physical electronic components (i.e. hardware) and any software and/or firmware ("code") which may configure the hardware, be executed by the hardware, and or otherwise be associated with the hardware. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be performed by one or more circuits. As utilized herein, the term "exemplary" means serving as a non-limiting example, instance, or illustration. As utilized herein, the term "e.g.," introduces a list of one or more non-limiting examples, instances, or illustrations.

FIG. 1 is a block diagram illustrating an electronic device comprising a digital-to-analog convertor (DAC) implementing R2R ladder based topology. Referring to FIG. 1 there is shown an electronic device 100.

The electronic device 100 may comprise suitable circuitry, interfaces, logic, and/or code that may be operable to perform various functions or operations, and/or run various applications and/or programs. In this regard, operations, functions, applications and/or programs supported by the electronic device 100 may be performed, executed and/or run based on user instructions and/or pre-configured instructions. In some instances, the electronic device 100 may enable communication of data or messages, such as via wired and/or wireless connections configured in accordance with one or more supported wireless and/or wired protocols or standards. Examples of electronic devices may comprise handheld mobile devices (e.g., cellular phones, smartphones, and/or tablets), computers (e.g., laptops, desktop or personal computers, and/or servers) networking equipment (e.g., routers, hubs, etc.), multimedia devices (e.g., televisions, DVD or Blu-ray players, etc.), audio playback systems, test and measurement equipment, and/or other similar devices. The disclosure, however, is not limited to any particular type of electronic devices.

In some instances, the electronic device 100 may comprise an audio system 110, which may be used in performing and/or supporting audio related operations (e.g., relating to capturing, generating, and/or outputting of audio) in the electronic device 100. In this regard, the audio system 100 may be used to, for example, facilitate playing back (prerecorded) digital audio content, via one or more speakers 112, which may be integrated into and/or coupled to the electronic device 100. The audio system 110 may comprise, for example, suitable circuitry, interfaces, logic and/or code for processing audio content, such as digital audio content, and to generate based on that processing appropriate electronic signals that may enable generating corresponding sound(s) via the speaker(s) 112. The audio system 110 may comprise, for example, a power amplifier 120 and a signal processing module 130. In this regard, the signal processing module 130 may comprise suitable circuitry, interfaces, logic, and/or code to perform such signal processing operations as filtering, amplification, digital-to-analog conversion, and encoding/decoding. The power amplifier 120 may comprise suitable circuitry, interfaces, logic and/or code for amplifying audio signals generated and/or obtained via the audio system 110 (e.g., via processing via the signal processing module 120) to a level(s) suitable for driving the speaker(s) 112.

In operation, the electronic device 100 may be used to run or execute various applications and/or functions, such as based on user instructions or interactions, and/or based on pre-configured instructions. In this regard, the electronic device 100 may perform in some instances, such as in support of particular applications or functions executed by the electronic device 100, audio related operations. For example, the electronic device 100 may be operable to playback audio content. In this regard, playing back audio content may comprise processing the audio content, which may be in the form of digital data, to enable generating corresponding electrical signals that may be used in driving the speaker(s) 112 in a manner that may allow for generating the appropriate corresponding sound(s).

In some instances, signal processing performed by the signal processing module 130 may comprise digital-to-analog conversions. In this regard, during digital-to-analog conversions, a digital or discrete input (e.g., binary code) may be converted to an analog signal (e.g., current, voltage, or electric charge). To that end, the signal processing module 130 may comprise one or more digital-to-analog convertors (DACs). For example, the signal processing module 130 may comprise a digital-to-analog convertor (DAC) 140, which may comprise suitable circuitry, interfaces, logic, and/or code operable to perform the necessary digital-to-analog conversions, such as by accurately translating a digital code into a corresponding (analog) current. In this regard, the DAC 140 may be implemented using various topologies and/or methodologies. One example of a DAC topology that may be utilized is R2R ladders. In this regard, an R2R ladder DAC topology may use current sources, of a unit size, and a passive resistive divider to generate binary weighted mapping of code (e.g., binary) to current. An example of a R2R ladder based DAC is described in more details in FIG. 2.

Figure 2:
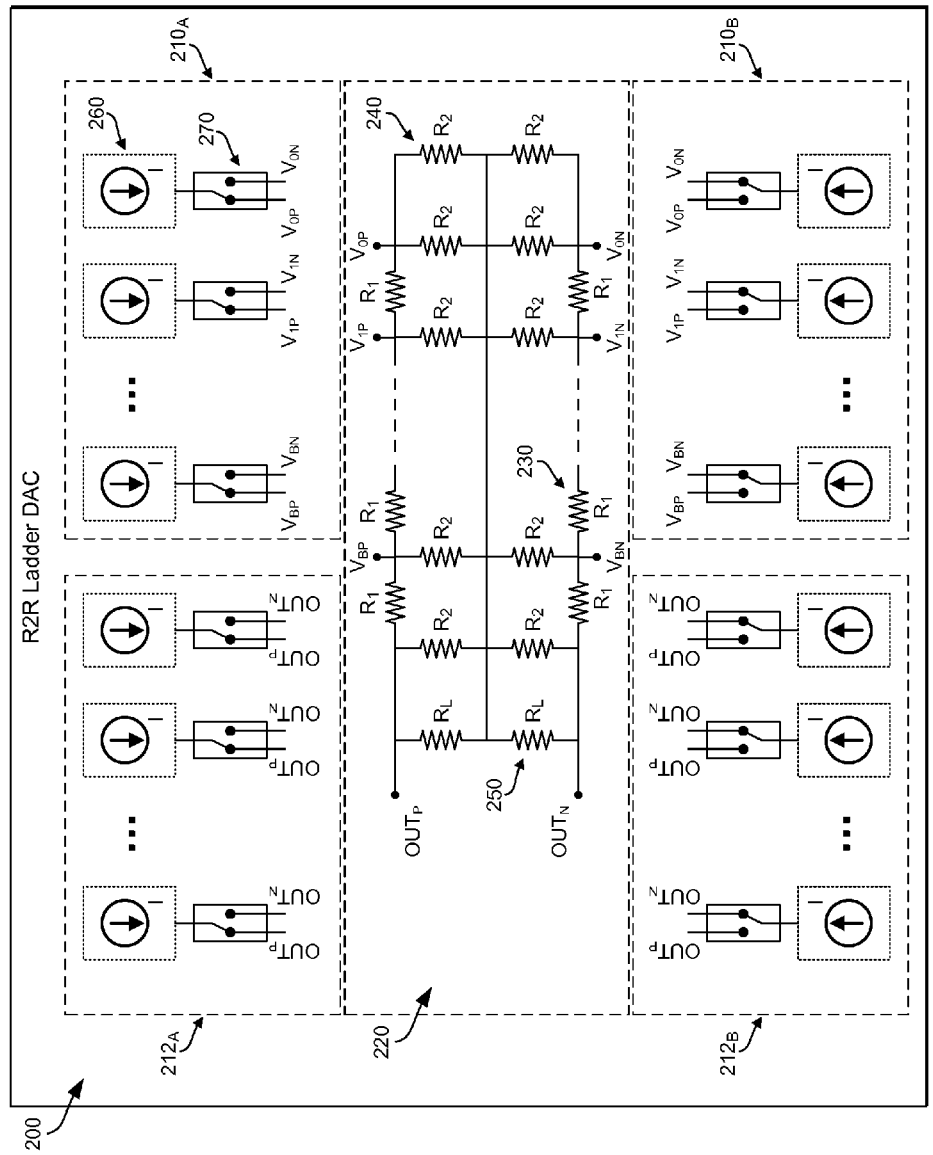
FIG. 2 is a block diagram illustrating an example of R2R ladder with modified current source units with auxiliary calibration circuitry for compensating for mismatch.

FIG. 2 is a block diagram illustrating an example of R2R ladder with modified current source units with auxiliary calibration circuitry for compensating for mismatch. Referring to FIG. 2 there is shown R2R ladder digital-to-analog convertor (DAC) 200.

The R2R ladder DAC 200 may comprise suitable circuitry, interfaces, logic, and/or code for translating a digital code into a corresponding (analog) current by using current sources of unit sizes and a passive resistive divider to generate a binary weighted mapping of code to current. In this regard, the R2R ladder DAC 200 may incorporate a differential based implementation. The R2R ladder DAC 200 may comprise, for example, two main current components $210_A$ and $210_B$, two segment current components $212_A$ and $212_8$, and a passive resistive divider component 220.

The two main current components $210_A$ and $210_B$ may comprise a plurality of current source units (260), with each current source unit having a corresponding switch element (270). The number of current source units may depend on the resolution of the R2R ladder DAC 200—i.e., maximum number of bits in input digital (binary) input codes that may be converted to analog signal via the R2R ladder DAC 200 (e.g., a DAC that converts binary codes of 24 bits has a resolution of 24). Each of the two main current components $210_A$ and $210_B$ may comprise B current source units (260) with a similar number of corresponding switch elements (270), where B is the bit resolution of the R2R ladder DAC 200 (e.g., B is 24 when the R2R ladder DAC 200 has a resolution of 24). Thus, the total number of the main current source units is 2B, split between the two main current components $210_A$ and $210_8$. Each of the two main current components $210_A$ and $210_B$ may be configured to apply their current(s)—that is from the current source units therein—to the positive-side or negative-side of the differential network implemented via the passive resistive divider component 220. For example, the switch elements (270) of the first main current components $210_A$ may be configured such that the outputs of the current source units therein are applied to the positive-side of the passive resistor divider component 220 (e.g., at $V_{OP}, V_{1P}, \ldots, V_{BP}$), whereas the second main current components $210_B$ may be configured such that the outputs of the current source units therein are applied to the negative-side of the passive resistor divider component 220 (e.g., at $V_{ON}, V_1N, \ldots, V_{BN}$).

Each of the two segment current components $212_A$ and $212_8$ may comprise T current source units (260), with each current source unit having a corresponding switch element (270). In this regard, the T current source units (along with the corresponding switch elements) may be correspond to T thermometer encoded segments which may be switched for the most significant bit (MSB) of the input binary code. As with the main current components $210_A$ and $210_B$, each of the segment current components $212_A$ and $212_B$ may be configured to apply their current(s)—that is from the current source units therein—to the positive-side or negative-side of an output section of the differential network (implemented via the passive resistive divider component 220). For example, the switch elements (270) of the first segment current component $212_A$ may be configured such that the outputs of the T current source units therein are applied to the positive-side of the output section of the passive resistor divider component 220, whereas the second segment current component $212_B$ may be configured such that the outputs T current source units therein are applied to the negative-side of the output section of the passive resistor divider component 220.

The passive resistive divider component 220 may comprise a plurality of resistors that may be placed in a particular manner, such as to allow for controlling the weights of the contributions of each of the bits in the input binary code (e.g., as represented by effect of corresponding current source units) applied towards to the overall output voltage(s), $OUT_P$ and $OUT_N$. For example, the passive resistive divider component 220 may comprise 2B $R_1$ 230, 2B $R_2$ 240, and 2 $R_L$ 250. In this regard, each $R_2$ 240 has twice the resistance of $R_1$ 230. The two $R_L$ 250 may be used (and as such their values maybe set accordingly) to provide a final tuning of the value of the output voltage(s), $OUT_P$ and $OUT_N$.

In operation, the R2R ladder DAC 200 may be used in converting input digital (binary) codes, having 'B' bits for example, into corresponding analog signals (e.g., continuous voltage output). For example, the R2R ladder DAC 200 may use the currents outputted by the current source units of the main current components $210_A$ and $210_B$ to generate, via the passive resistive divider component 220 in a differential manner, a binary weighted mapping of the input digital codes. In this regard, each of the current source units (260) of the main current components $210_A$ and $210_B$ may be turned on or off based on the value of the corresponding bits in the input binary code—e.g., each of current source units may be turned off or on based on whether the corresponding bit is set to logic '0' or logic '1', respectively.

An important consideration with respect to the operation of the R2R ladder DAC 200 is accuracy. In this regard, the accuracy of the overall current output of R2R ladder DAC 200 may depend on matching between the current source units (260) and the matching between resistors of the passive resistive divider component 220 of the R2R ladder DAC 200. Any inaccuracy in this binary weighting may result in distortion at the overall output of the R2R ladder DAC 200. For high resolution applications, such as audio, matching in excess of a particular value (e.g., 18 bits) may be used to meet distortion specifications. However, in some instances, during fabrication of circuits (e.g., the R2R ladder DAC 200) random mismatch may be introduced, which in typical semiconductor process may be in the 10-12 bit range. In other words, inaccuracies in the currents outputted by the current source units (260) may lead to mismatch in the corresponding weights applicable to the overall voltage(s).

Accordingly, in various implementations, a modified current source unit structure may be configured to enable compensating for mismatches in the current sources used in such circuits as those implementing R2R ladders (e.g., the R2R ladder DAC 200). For example, each modified current source unit may comprise, in addition to the main current source, one or more auxiliary current sources, which may be calibrated (e.g., during fabrication and/or testing) to output auxiliary currents which may be used in adjusting the overall output value of the modified current source unit such as to ensure proper matching during operation of the R2R ladder circuit. In an R2R ladder DAC topology incorporating differential implementation (e.g., the R2R ladder DAC 200), with positive and negative-sides in the passive resistive divider, the modified current source unit may comprise, in addition to the main current source, two auxiliary current sources added in parallel to the main current source, with one of the auxiliary current sources being switched on to the positive-side and the other one where being switched on to the negative-side. An example of a modified current source unit is described in more details in FIG. 3.

Figure 3:
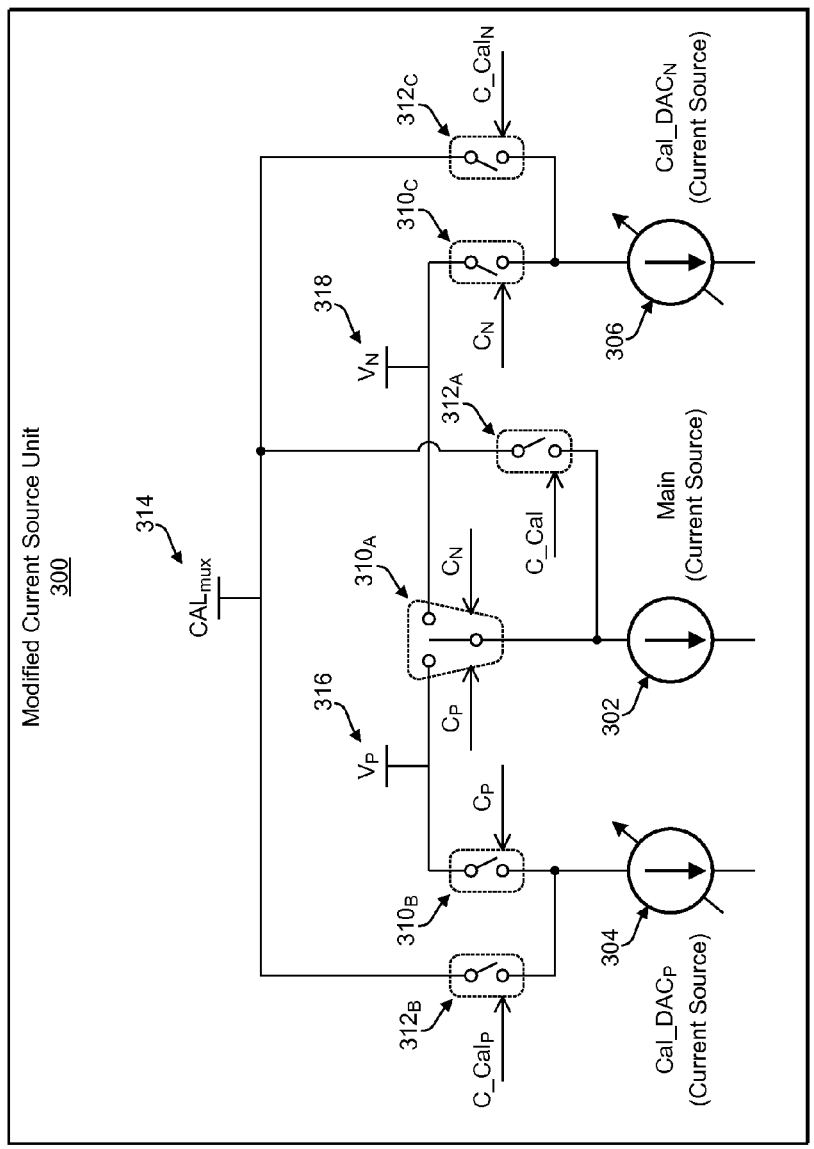
FIG. 3 is a block diagram illustrating an example of a current source unit with auxiliary calibration circuitry for compensating for mismatch.

FIG. 3 is a block diagram illustrating an example of a current source unit with auxiliary calibration circuitry for compensating for mismatch. Referring to FIG. 3, there is shown a modified current source unit 300.

The current source unit 300 may correspond to a modified current source unit, which may enable compensating for mismatches that may be associated with current sources used in particular circuits, such as circuits used in implementing R2R ladders (e.g., as current source units 260 of the R2R ladder DAC 200). In this regard, the current source unit 300 may comprise suitable circuitry, interfaces, logic, and/or code for generating and/or calibrating a main current and one or more auxiliary currents, which may be used in setting and/or adjusting the overall output value of the current source unit 300, such as to ensure proper matching during operation of a R2R ladder circuit (e.g., used as DAC) incorporating instances of the current source unit 300. In some instances, the current source unit 300 may be configured to support operations in R2R ladder topologies incorporating differential implementation (e.g., the R2R ladder DAC 200), having positive and negative-sides in the passive resistive divider. For example, the current source unit 300 may comprise a main current source 302, two auxiliary current sources, a positive-side auxiliary calibration (Cal_DAC$_P$) current source 304 and a negative-side auxiliary calibration (Cal_DAC$_N$) current source 306, which may be added in parallel to the main current source 302.

The current source unit 300 may additionally comprise a plurality of switch elements $310_A$, $310_B$, $310_C$, $312_A$, $312_B$, and $312_C$), which may be used in establishing connections within the main current source unit 300, so as to enable switching the main current source and/or the auxiliary current source(s) in particular manner, such as, for example, switching these sources on to the positive-side or to the negative-side, during normal operations and/or calibration runs. In this regard, operations (e.g., switching) of the switch elements $310_A$, $310_B$, $310_C$, $312_A$, $312_B$, and $312_C$ may be controlled using controlling signals that may be asserted to outcome of switching in these elements.

During calibration testing of the current source unit 300, overall output of the circuit incorporating the current source unit 300 (or multiple instances thereof) may be measured to determine any mismatch associated with each unit. For example, where the current source unit 300 is incorporated into a R2R ladder, such as the R2R ladder DAC 200, the overall R2R ladder DAC output may be measured, and each calibration DAC—i.e., for each bit—may be adjusted so that it may sufficiently compensate for mismatch in both the current units and the resistors of the passive resistive divider component (220).

In some instances, an auxiliary calibration multiplexer (CAL$_{mux}$) port 314 may be used in facilitating calibration of the current source unit 300, within a topology (e.g., R2R ladder) comprising one or instances of the unit, using the associated calibration circuitry. In this regard, the $CAL_{mux}$ port 314 may allow directly measuring the current source unit 300, with the associated calibration circuitry. The $CAL_{mux}$ port 314 may be used to switch currents away (e.g., using switch elements $310_A$, $310_B$, and $310_C$) from the main R2R ladder, which may allow any combination of current units utilized by the calibration algorithm to be measured directly, at the R2R ladder output for example.

In this regard, control signals C_Cal, $C\_Cal_P$, and $C\_Cal_N$ may be asserted and/or deasserted, based on a desired switching on/off outcome during the calibration test, while control signals $C_P$ and $C_N$ may be deasserted, thus switching off the switch elements $310_A$, $310_B$, and $310_C$. For example, control signal C_Cal may be asserted, thus switching on the switch element $312_A$, to connect the main current source 302 to the $CAL_{mux}$ port 314, thus drawing the current generated by the main current source 302 away from the main R2R ladder. In a similar manner, control signal $C\_Cal_P$ may be asserted, thus switching on the switch element $312_B$, to connect the main current source 304 to the $CAL_{mux}$ port 314, thus drawing the current generated by the auxiliary $Cal\_DAC_P$ current source 304 away from the main R2R ladder (during positive-side calibration); and control signal $C\_Cal_N$ may be asserted, thus switching on the switch element 312, to connect the auxiliary $Cal\_DAC_N$ current source 306 to the $CAL_{mux}$ port 314, thus drawing the current generated by the auxiliary $Cal\_DAC_N$ current source 306 away from the main R2R ladder (during negative-side calibration). On the other hand, the control signals C_Cal, $C\_Cal_P$, $C\_Cal_N$ and may be deasserted to switch off switch elements $312_A$, $312_B$, $312_C$ and thus disconnect the corresponding current sources (main) 302, (Cal_$DAC_P$) 304, and (Cal_$DAC_N$) 306, respectively, from the $CAL_{mux}$ port 314. Once calibration testing is complete, the determined calibration DAC values—i.e., values needed to compensate for any mismatch—may be computed, then stored (e.g., in a non-volatile memory), and loaded thereafter into the calibration DACs upon chip power up or reset.

During normal operations, the current source unit 300 may be connected to either positive voltage ($V_P$) port 316 or negative voltage ($V_N$) port 318, for example, depending on whether the output of the current source unit 300 is being applied to the positive-side or negative-side of the differential R2R ladder DAC circuit. In this regard, control signals C_Cal, $C\_Cal_P$, and $C\_Cal_N$ may be deasserted, to switch off the switch elements $312_A$, $312_B$, and 312, and thus disconnect the corresponding current sources—that is the main current source 302, the auxiliary $Cal\_DAC_P$ current source 304, and the auxiliary $Cal\_DAC_N$ current source 306, respectively—from the $CAL_{mux}$ port 314 that is only used for calibration purposes. On the other hand, the control signals $C_P$ and $C_N$ may be asserted and/or deasserted adaptively, based on a desired switching on/off outcome. For example, when the output of the main current unit 300 is applied to positive-side, signal $C_P$ may be asserted while signal $C_N$ may be deasserted. Thus, both the main current source 302 and the auxiliary $Cal\_DAC_P$ current source 304 may be connected to the $V_P$ port 316, via switch elements $310_A$ and $310_B$, while the auxiliary $Cal\_DAC_N$ current source 306 may be disconnected from the $V_N$ port 318 by switching off the switch elements $310_C$ (due to deasserting $C_N$). Similarly, when the output of the main current unit 300 is applied to negative-side, signal $C_N$ may be asserted while signal $C_P$ may be deasserted. Thus, both the main current source 302 and the auxiliary $Cal\_DAC_N$ current source 306 may be connected to the $V_N$ port 318, via switch elements $310_A$ and $310_C$, while the auxiliary Cal_$DAC_P$ current source 304 may be disconnected from the $V_P$ port 316 by switching off the switch elements $310_B$ (due to deasserting $C_P$).

Figure 4:
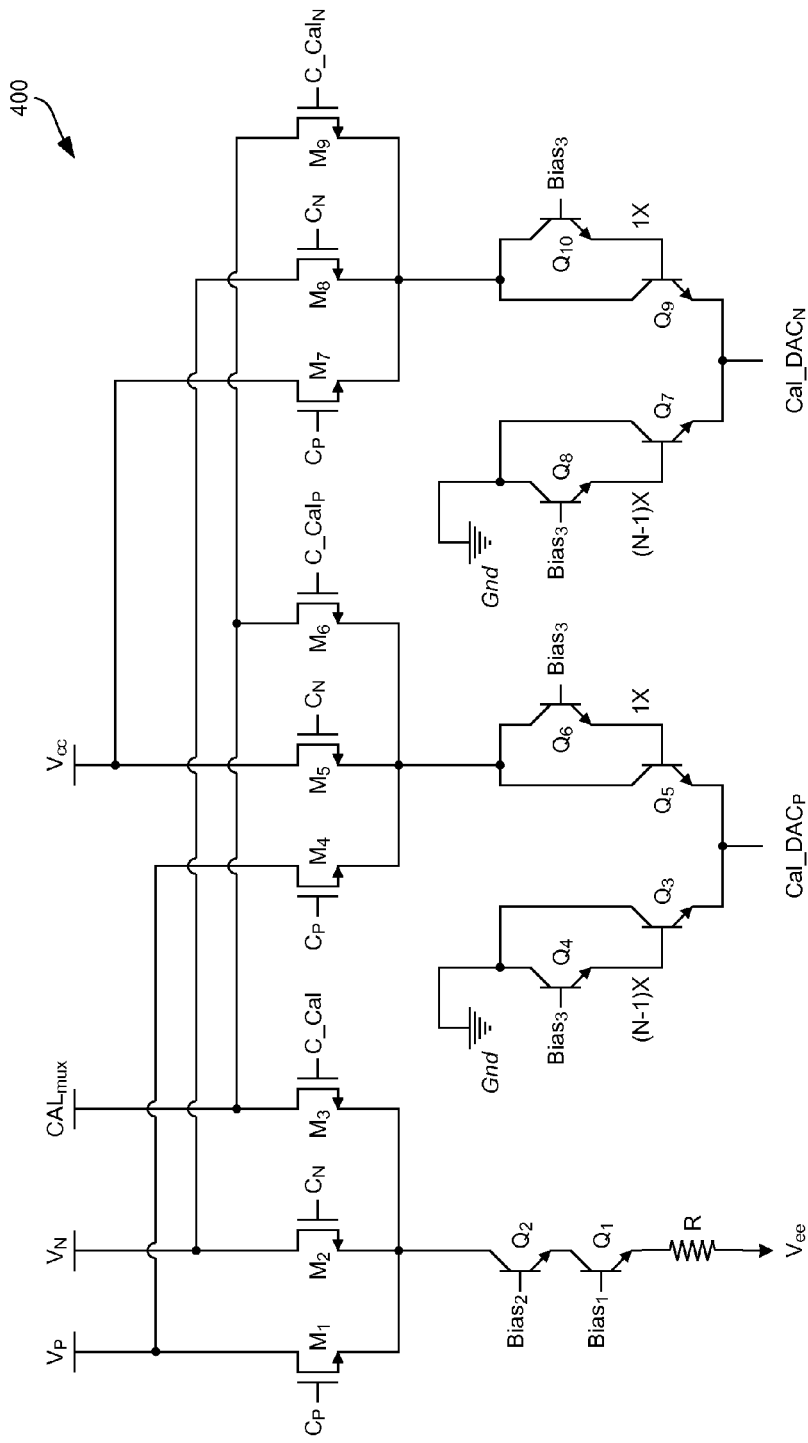
FIG. 4 is a block diagram illustrating an example of a BiCMOS implementation of current source unit with auxiliary calibration circuitry for compensating for mismatch.

The switching structure described herein, to provide the desired calibration and/or mismatch compensation based thereon, may be implemented using various topologies and/or technologies. For example, the current source unit 300 may be implemented using any suitable semiconductor technology that may allow, for example, for on-chip transistors and resistors. FIG. 4 describes a possible BiCMOS technology implementation of the current source unit 300.

FIG. 4 is a block diagram illustrating an example of a BiCMOS implementation of current source unit with auxiliary calibration circuitry for compensating for mismatch. Referring to FIG. 4, there is shown a BiCMOS based circuit topology 400 corresponding to an implementation of the current source unit 300 of FIG. 3. In this regard, BiCMOS based circuit topology is a semiconductor topology in which separate semiconductor technologies—namely, bipolar junction transistor (BJT) and complementary metal-oxide-semiconductor (CMOS) transistor—are incorporated in a single integrated circuit.

The circuit 400 may comprise, for example, MOS (CMOS) transistors $M_1$-$M_9$, and bipolar (BJT) transistors $Q_1$-$Q_{10}$. The circuit 400 may also comprise a resistor R. The circuit 400 may be configured to perform the functions and/or operations described with respect to the modified current source unit 300 of FIG. 3. In this regard, the circuit 400 may be operable to provide a main current and plurality of auxiliary currents (e.g., two, corresponding to negative-side and positive-side of differential based topology). The auxiliary currents may be used in compensating for mismatch during use of circuit 400 as a current source unit within a R2R ladder DAC topology. The circuit 400 may also be operable to support calibration of the current generation performed thereby. In this regard, the calibration may comprise determining auxiliary current(s) for accurate mismatch compensation.

In an example implementation, bipolar (BJT) transistors $Q_1$ and $Q_2$, and resistor R1 may be connected in series (as shown in FIG. 4), to form a cascaded emitter degenerated current source, which is used as the main current segment (i.e., corresponding to the main current source 302 of FIG. 3). MOS transistors $M_1$, $M_2$ and $M_3$ may be used to connect the collector of transistor Q1 to positive voltage ($V_P$), negative voltage ($V_N$), and auxiliary calibration multiplexer ($CAL_{mux}$), respectively. In this regard, the MOS transistors $M_1$, $M_2$ and $M_3$ may act as switches (e.g., corresponding to switch elements $310_A$ and $312_A$ of FIG. 3) to connect the main current to the $V_P$, the $V_N$, or the $CAL_{mux}$ as the controls may dictate (e.g., assertion or value of each of control signals $C_P$, $C_N$, and C_Cal). Remaining bipolar transistors $Q_3$-$Q_{10}$. In this regard, calibration currents may be injected into the Cal_$DAC_P$ and Cal_$DAC_N$ ports, respectively (corresponding to auxiliary current sources 304 and 306 of FIG. 3). In this regard, the transistors $Q_3$-$Q_6$ and $Q_7$-$Q_{10}$ may divide the calibration currents by a particular factor (e.g., 'N'). In this manner, calibration of the current source unit (400) may be performed in fine steps while allowing a calibration DAC least significant bit (LSB) that is large enough to be easily implemented on-chip. The MOS transistors $M_4$-$M_6$ and $M_7$-$M_9$ may be used in providing the switching for the positive-side and the negative-side, respectively. In this regard, the MOS transistors $M_4$-$M_6$ may connect the positive calibration DAC to the $V_P$, a positive supply $V_{CC}$, or to the $CAL_{mux}$, for example, depending on the state of the controls (e.g., assertion or value of each of control signals $C_P$, $C_N$, and $C\_Cal_P$). Similarly, the MOS transistors $M_7$-$M_9$ may connect the negative calibration DAC to the $V_N$, a positive supply $V_{CC}$, or to the $CAL_{mux}$, for example, depending on the state of the controls (e.g., assertion or value of each of control signals $C_P$, $C_N$, and $C\_Cal_N$). The connection to $V_{CC}$ may be required to keep the Cal_DAC on independent of the state of the controls.

Figure 5B:
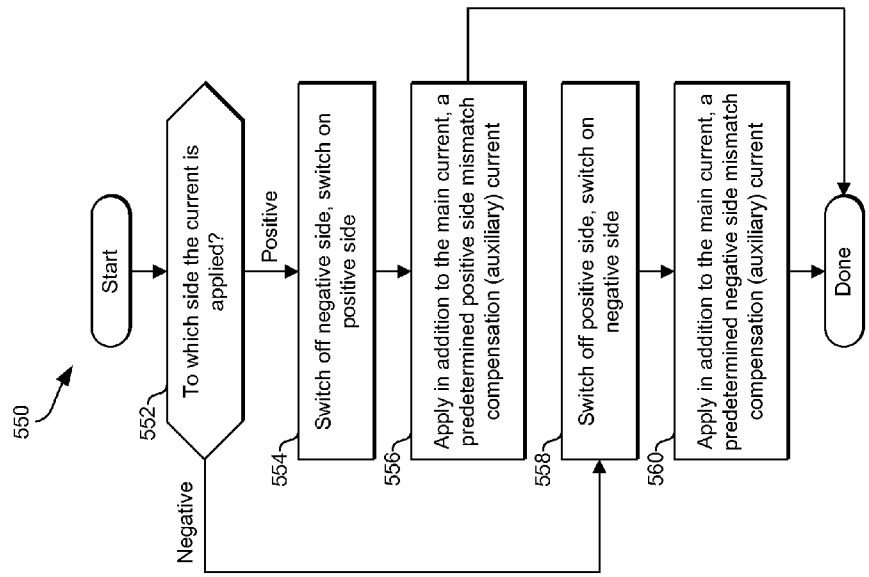
FIG. 5B is a flow chart that illustrates an example of compensation for mismatch via auxiliary current sources during normal operation of a modified current source unit.
Figure 5A:
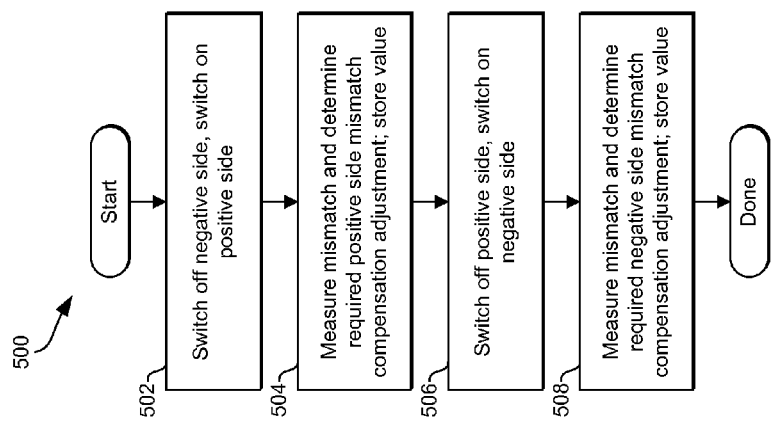
FIG. 5A is a flow chart that illustrates an example of calibration of auxiliary current sources of a modified current source unit.

FIG. 5A is a flow chart that illustrates an example of calibration of auxiliary current sources of a modified current source unit. Referring to FIG. 5A, there is shown a flow chart 500 comprising a plurality of example steps for calibrating mismatch compensating in each of a plurality of modified current source units (e.g., instances of unit 300) of a R2R ladder (e.g., R2R ladder DAC 200).

In step 502, negative-side related components or functions in the current source unit may be switched off while positive-side related components or functions in the current source unit may be switched on. For example, such switching off/on may be achieved by deasserting control signals $C\_Cal_N$, $C_P$ and $C_N$, while asserting control signals $C\_Cal$, $C\_Cal_P$. In step 504, mismatch occurring when main current of the current source unit is applied at the positive-side may be measured, and corresponding positive-side mismatch compensation adjustment may be measured and/or determined. The value of the measured compensation adjustment may be stored. In step 506, positive-side related components or functions in the current source unit may be switched off while negative-side related components or functions in the current source unit may be switched on. For example, such switching off/on may be achieved by deasserting control signals $C\_Cal_P$, $C_P$ and $C_N$, and asserting control signals $C\_Cal$, $C\_Cal_N$. In step 508, mismatch occurring when main current of the current source unit at the negative-side is applied may be measured, and corresponding negative-side mismatch compensation adjustment may be measured and/or determined. The value of the measured compensation adjustment may be stored.

FIG. 5B is a flow chart that illustrates an example of compensation for mismatch via auxiliary current sources during normal operation of a modified current source unit. Referring to FIG. 5B, there is shown a flow chart 550 comprising a plurality of example steps performed by each of a plurality of modified current source units (e.g., instances of unit 300), such as of an R2R ladder (e.g., R2R ladder DAC 200), which may be configured to provide mismatch compensation during operations thereof.

In step 552, a determination may be performed as to which side the current of the modified current source unit (e.g. positive-side or negative-side) is being applied. In instances where it may be determined that the current of the modified current source unit is being applied to the positive-side, the process may proceed to step 554. In step 554, negative-side related components or functions in the current source unit may be switched off while positive-side related components or functions in the current source unit may be switched on. For example, such switching off/on may be achieved by deasserting control signals $C\_Cal$, $C\_Cal_P$, $C\_Cal_N$, and $C_N$, and asserting control signal $C_P$. In step 556, a predetermined positive-side mismatch compensation (auxiliary) current may be applied in addition to the main current. For example, in addition the main current applied by the main current source 302, a positive-side mismatch compensation current may be applied (e.g., from the $Cal\_DAC_P$ source 304). Returning to step 552, in instances where it may be determined that the current of the modified current source unit is being applied to the negative-side, the process may proceed to step 558. In step 558, positive-side related components or functions in the current source unit may be switched off while negative-side related components or functions in the current source unit may be switched on. For example, such switching off/on may be achieved by deasserting control signals $C\_Cal$, $C\_Cal_P$, $C\_Cal_N$, and $C_P$, and asserting control signal $C_N$. In step 560, a predetermined negative-side mismatch compensation (auxiliary) current may be applied in addition to the main current. For example, in addition the main current applied by the main current source 302, a negative-side mismatch compensation current may be applied (e.g., from the $Cal\_DAC_N$ source 306).

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for calibration of an R2R ladder based current digital-to-analog convertor (DAC).

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein. A combination of hardware and software may also be a specialized computer system, such as a semiconductor automated test equipment (ATE) system or programmed into a field programmable gate array (FPGA). Specialized hardware such as a comparator or analog-to-digital converter may also be utilized to perform mismatch measurements.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A method for controlling operation of a R2R ladder circuit, comprising:
   compensating for mismatch in a plurality of current sources in the R2R ladder circuit, the compensating comprising:

applying during operation of each one of the plurality of current sources, an auxiliary current from at least one auxiliary current source associated with each of the plurality of current sources, wherein the auxiliary current is applied concurrently with a current applied from a corresponding one of the plurality of current sources;

calibrating the R2R ladder circuit to determine the auxiliary current associated with each of the plurality of current sources; and determining a required compensation for correcting a mismatch resulting in the R2R ladder circuit from applying a current from a corresponding one of the plurality of current sources.

2. The method of claim 1, comprising selecting the at least one auxiliary current source from a plurality of auxiliary current sources, associated with each of the plurality of current sources, when applying the auxiliary current.

3. The method of claim 2, wherein the plurality of auxiliary current sources comprises a negative-side auxiliary current source and a positive-side auxiliary current source when the R2R ladder circuit comprises a differential circuit with negative-side and positive-side current sources.

4. The method of claim 1, comprising applying the auxiliary current in parallel with the current applied from the corresponding one of the plurality of current sources.

5. The method of claim 1, comprising configuring the auxiliary current based on the required compensation.

6. A R2R ladder circuit, comprising:
a plurality of resistors;
a plurality of current sources;
a plurality of auxiliary current sources associated with each of plurality of current sources; and
a calibration sub-circuit associated with each of the plurality of current sources for calibrating the corresponding plurality of auxiliary current sources to provide
an auxiliary current from at least one of a corresponding plurality of auxiliary current sources based on a determination of mismatch at the corresponding one of the plurality of current sources.

7. The R2R ladder circuit of claim 6, comprising selecting the at least one of the corresponding plurality of auxiliary current sources, when applying the auxiliary current.

8. The R2R ladder circuit of claim 6, wherein the plurality of auxiliary current sources comprises a negative-side auxiliary current source and a positive-side auxiliary current source when the R2R ladder circuit comprises a differential circuit with negative-side and positive-side current sources.

9. The R2R ladder circuit of claim 6, wherein the plurality of current sources is configured to apply the auxiliary current in parallel with a current applied from a corresponding one of the plurality of current sources.

10. The R2R ladder circuit of claim 6, wherein each of the plurality of auxiliary current sources is calibrated to provide a particular auxiliary current.

11. The R2R ladder circuit of claim 6, wherein the calibration sub-circuit associated with each of plurality of current sources is configured to determine the auxiliary current associated with each of the corresponding plurality of auxiliary current sources based on a determination of required compensation for a mismatch at the corresponding one of the plurality of current sources.

12. A current source unit circuit, comprising:
a main current source, configured to output a main current;
a plurality of auxiliary current sources, wherein each of the plurality of auxiliary current sources is configured to output a corresponding auxiliary current; and
a plurality of switching elements configured to control outputting of the main current and auxiliary currents from the plurality of auxiliary current sources, wherein the switching elements are configured in accordance with each of a plurality of modes of operation of the current source unit circuit
wherein the current source unit circuit is implemented using a BiCMOS-based implementation including at least one bipolar transistor implementing one or more of the main current source and the plurality of auxiliary current sources, and at least one MOS transistor implementing one or more of the plurality of switching elements.

13. The current source unit circuit of claim 12, wherein the plurality of modes of operations of the current source unit circuit comprise one or more calibration based modes and/or one or more normal operation based modes.

14. The current source unit circuit of claim 13, wherein the one or more calibration based modes comprise a negative-side calibration and a positive-side calibration applicable in a differential based system incorporating the current source unit circuit.

15. The current source unit circuit of claim 13, wherein the one or more normal operation based modes comprise a negative-side operation and a positive-side operation applicable in a differential based system incorporating the current source unit circuit.

* * * * *